United States Patent
Chu

(12) United States Patent (10) Patent No.: US 7,163,868 B2
Chu (45) Date of Patent: Jan. 16, 2007

(54) METHOD FOR FORMING A LIGHTLY DOPED DRAIN IN A THIN FILM TRANSISTOR

(75) Inventor: Te-Ming Chu, Taoyuan (TW)

(73) Assignee: Chunghwa Picture Tubes, Ltd. (TW)

( * ) Notice: Subject to any disclaimer, the term of this patent is extended or adjusted under 35 U.S.C. 154(b) by 393 days.

(21) Appl. No.: 10/862,443

(22) Filed: Jun. 8, 2004

(65) Prior Publication Data

US 2005/0272186 A1 Dec. 8, 2005

(51) Int. Cl.
*H01L 21/20* (2006.01)
*H01L 21/84* (2006.01)
*H01L 21/00* (2006.01)

(52) U.S. Cl. .................. 438/383; 438/151; 438/514; 438/149; 438/163; 438/164; 438/609; 438/238; 438/30; 257/72; 257/E21.437

(58) Field of Classification Search ............... 438/383, 438/151, 514, 149, 163–164, 609, 238, 30; 257/72
See application file for complete search history.

(56) References Cited

U.S. PATENT DOCUMENTS

2004/0126914 A1* 7/2004 Chang et al. .................. 438/30
2004/0185607 A1* 9/2004 Shih et al. .................. 438/151

* cited by examiner

*Primary Examiner*—Michael Lebentritt
*Assistant Examiner*—Mohsen Ahmadi

(57) ABSTRACT

In accordance with the present invention, a gate electrode structure with inclined planes is used as a mask when performing an ion implantation process. The inclined planes are used to define the lightly doped drain (LDD) region in the active area. Therefore, the width of the LDD can be defined by the geometry of the inclined planes.

8 Claims, 4 Drawing Sheets

METHOD FOR FORMING A LIGHTLY DOPED DRAIN IN A THIN FILM TRANSISTOR

FIELD OF THE INVENTION

The present invention relates to a transistor device, and especially to a method for manufacturing a lightly doped drain region in a thin film transistor.

BACKGROUND OF THE INVENTION

In general, the TFT-LCD comprises a bottom plate on which thin film transistors and pixel electrodes are formed, and a top plate on which color filters are constructed. The liquid crystal molecules are filled between the top plate and the bottom plate. During operation, a signal voltage is applied to the TFT, which is the switching element of each pixel unit. The TFT receives the signal voltage and it turns on so that data voltage carrying image information can be applied to the corresponding pixel electrode and to the liquid crystal via the TFT. When the data voltage is applied to the TFT, the orientation of the liquid crystal molecules is changed, thereby altering the optical properties and displaying the image.

FIG. 1 illustrates the typical thin film transistor structure. An active region 104 is formed by a polysilicon thin film and defined by a patterned photoresist layer (not shown in this figure) that is deposited over a glass substrate 100. Then, another patterned photoresist layer (also not shown in this figure) is formed over the substrate 100 and partially over the active region 104. Next, an ion implanting process is performed using this photoresist as a mask to form the source/drain structure 112 in the active region 104. An insulating layer 106 is formed over the active region 104 and the glass substrate 100 to serve as a gate electrode dielectric layer. A metal layer 108 is formed over the insulating layer 106. Then, a patterned photoresist layer 110 is formed over the metal layer 108 to define a gate structure 122 as shown in FIG. 2.

In FIG. 2, an additional lightly doped region adjacent to the source/drain structure 112 is formed in the active region 104 to avoid the thermionic electron effect and the punch-through phenomenon, as well as to reduce the leakage of current while the transistor is in the "off" state. An additional ion implanting process is performed to form the lightly doped region, named lightly doped drain 116, using the gate structure as the mask.

According to the prior art, at least one mask each is required to form the source/drain structure 112 and the lightly doped drain 116. If misalignment happens in an exposure process, the two lightly doped drains 116 will have different resulting widths. Even if only one lightly doped drain 116 is formed in the active region 104, such a misalignment produces a structure which shifts the electrical characteristics of the transistor. Therefore, a manufacturing method for solving the above problem is required.

SUMMARY OF THE INVENTION

The main purpose of the present invention is to provide a method for manufacturing a thin film transistor. A gate electrode with inclined planes is used to form the lightly doped drain, which can eliminate using photolithography and thereby reduce the probability of misalignment.

The other purpose of the present invention is to provide a high yield manufacturing method of a thin film transistor liquid crystal display.

In accordance with the foregoing purposes, the present invention discloses a method for forming a lightly doped drain. The method comprises the following steps. First, an active layer is formed over a substrate. An insulating layer is formed over the active layer. A gate electrode with inclined planes is formed over the insulating layer. An isotropic wet etching process is performed in a metal layer to form the gate electrode. Then, an ion implanting process is performed to form doped regions in the active layer using the gate electrode as a mask. The region in the active layer exposed by the gate electrode is heavily doped to form the source/drain electrode. The region in the active layer under the inclined planes of the gate electrode is lightly doped to form the lightly doped drain. A passivation layer is formed over the gate electrode and the insulating layer. Finally, a contact hole is formed in the passivation layer to expose the top surface of the source/drain electrode.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Without limiting the spirit and scope of the present invention, the method proposed in the present invention is illustrated with one preferred embodiment of forming a lightly doped drain in a thin film transistor. Skilled artisans, upon acknowledging the embodiments, can apply the present invention to any kind of TFT apparatus to reduce the misalignment due to different photolithography processes entailed in forming the source/drain electrode and the lightly doped drain. The different photolithography processes often cause overlapping between the source/drain electrode and the lightly doped drain, which shifts the electrical characteristics. The following paragraphs describe the manufacturing method of the present invention. The usage of the present invention is not limited by the embodiment that follows.

Figure 1:
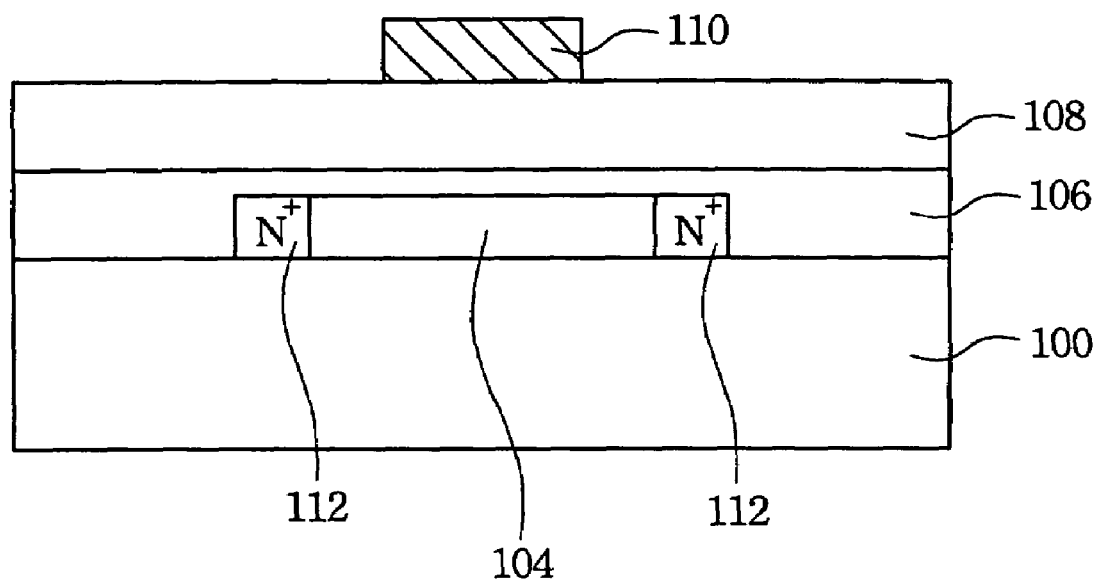
FIGS. 1 and 2 illustrate cross-sectional views of a typical thin film transistor.
Figure 2:
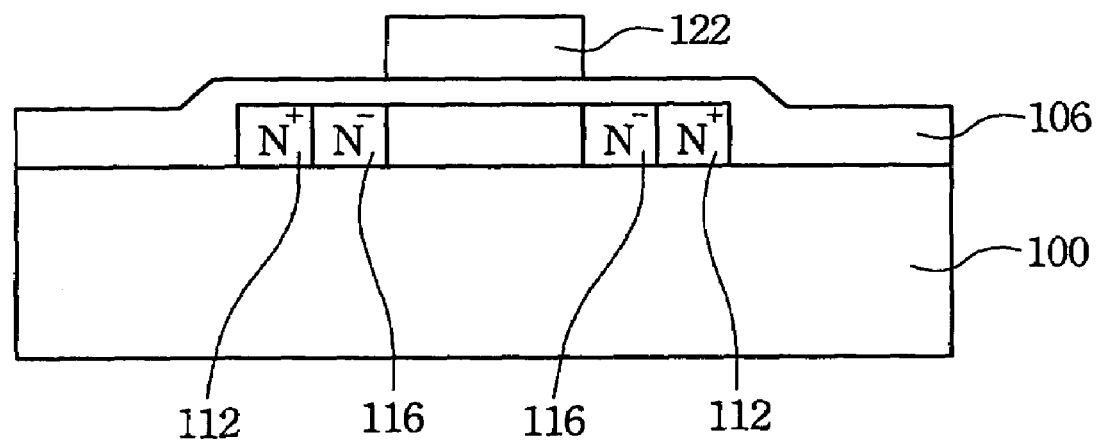
Figure 3:
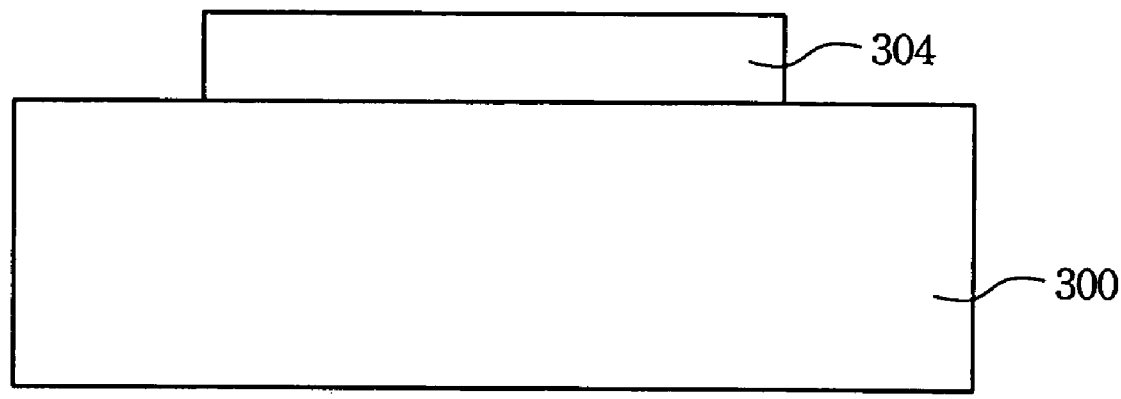
FIG. 3 is a cross-sectional view of a substrate that illustrates the step of forming an active region over the substrate in accordance with the present invention.

In FIG. 3, a transparent insulator substrate is illustrated, which is comprised of a glass, a quartz, or the like. In this preferred embodiment, the transparent insulator substrate is a glass substrate 300. Next, an amorphous silicon layer is formed on the glass substrate 300. An annealing process is performed to convert the amorphous silicon layer to a polysilicon layer. Next, a patterned photoresist layer (not shown in this figure) is formed over the polysilicon layer. An etching process is performed in the polysilicon layer to form an active region 304 over the substrate 300 using the patterned photoresist layer as a mask. Finally, the patterned photoresist layer is removed.

Figure 4:
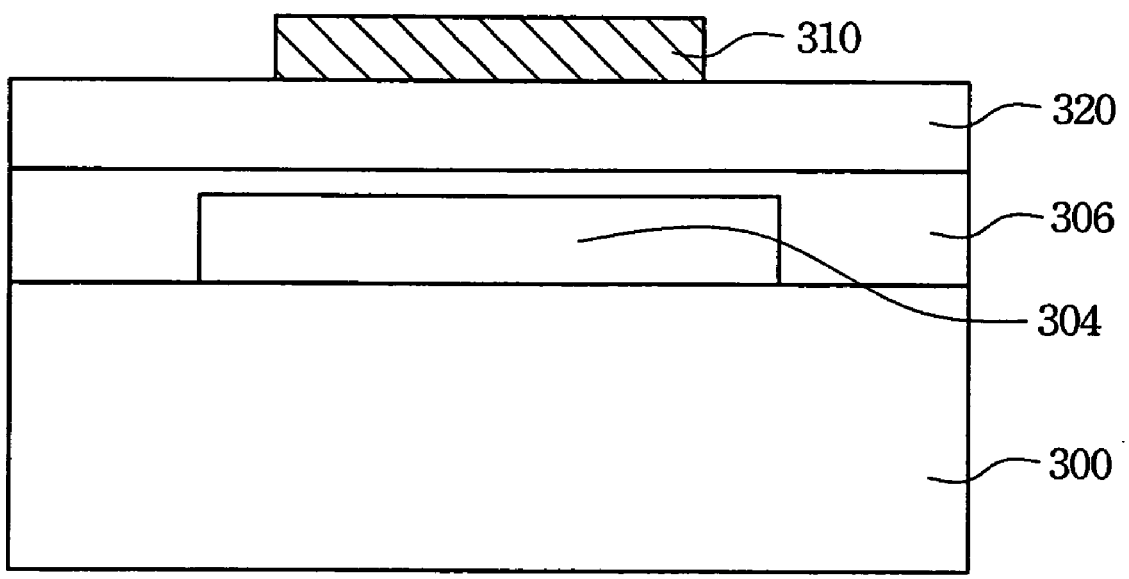
FIG. 4 is a cross-sectional view of a substrate that illustrates the steps of sequentially forming an insulating layer, a metal layer and a photoresist layer in accordance with the present invention.

In FIG. 4, an insulating layer 306 is formed over the active region 304 to serve as the gate insulating layer. In a preferred embodiment, the insulating layer is comprised of silicon oxide. The silicon oxide layer can be formed by plasma enhanced chemical vapor deposition (PECVD). Next, a metal layer 320 is formed over the insulating layer 306. In a preferred embodiment, the metal layer 320 can be formed by sputtering. Typically, the material of the metal layer 320 can be chosen from the group consisting of chromium (Cr), tungsten (W), titanium (Ti), tantalum (Ta), molybdenum (Mo), aluminum (Al), copper (Cu) and various alloys. Then, a patterned photoresist layer 310 is formed over the metal layer 320 to define a gate electrode structure.

An isotropic etching process is performed in the metal layer 320 to form a gate electrode structure using the patterned photoresist layer 310 as a mask. In a preferred embodiment of the present invention, the layer is wet etched by using a solution of HCl and $HNO_3$ or a solution of HCl and $FeCl_2$. Because every position of the metal layer 320 is equally etched, the metal layer 320 under the photoresist layer 310 is also etched to form a gate electrode with inclined planes 322A as shown in the FIG. 5. Next, the photoresist 310 is removed. It is noticed that the inclined angles of the inclined planes 322A of the gate electrode can be controlled by modifying the ratio of the etchant.

Figure 6:
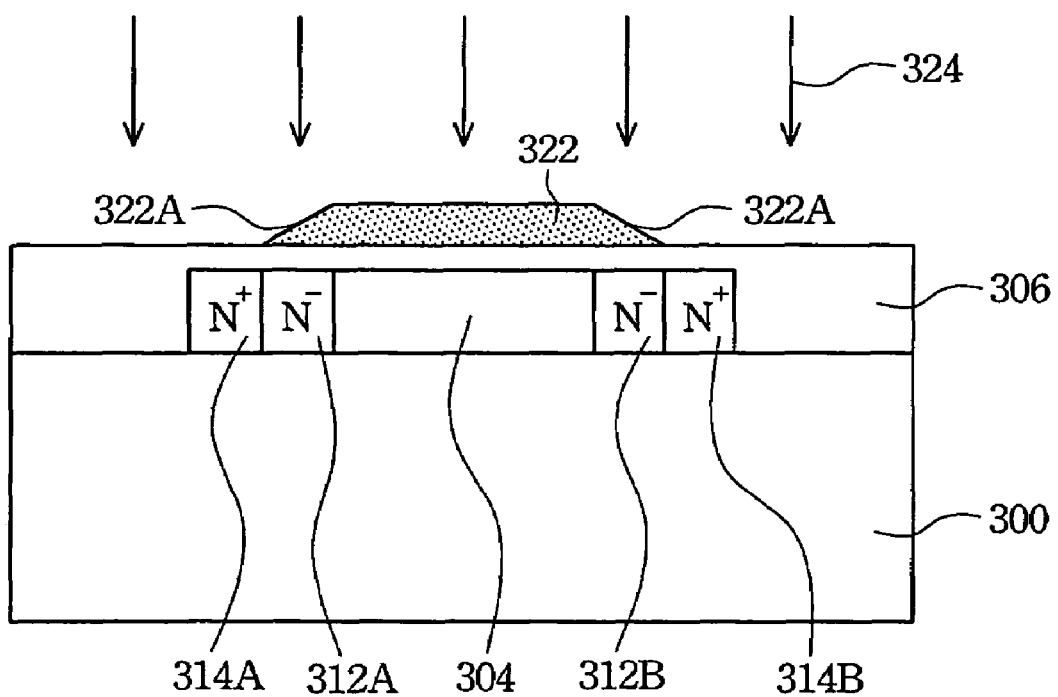
FIG. 6 is a cross-sectional view of a substrate that illustrates the step of performing ion implantation to form the source/drain region and the lightly doped drain in accordance with the present invention.

In FIG. 6, a P-type or N-type ion implantation, following the arrow direction 324, is performed for forming four doped regions 314A, 312A, 314B and 312B in the active region 304. The doped regions 314A and 314B exposed by the gate electrode 322 are heavily doped to form the source/drain electrode. In the preferred embodiment, the doped polarity of the doped regions 314A and 314B is N+. However, the inclined planes 322A can partially resist the ion implantation. Therefore, the doped regions 312A and 312B under the inclined planes 322A of the gate electrode are lightly doped to form the lightly doped drain. In the preferred embodiment, the doped polarity of the doped regions 312A and 312B is N–. The width of the doped regions 312A and 312B is related to the inclined planes 322A of the gate electrode 322. In other words, the present invention can indirectly control the width of the doped regions 312A and 312B by modifying the geometry of the inclined planes 322A. The region under the gate insulating layer 306 and among the four doped regions 314A, 312A, 314B and 312B is the channel of the thin film transistor.

Figure 7:
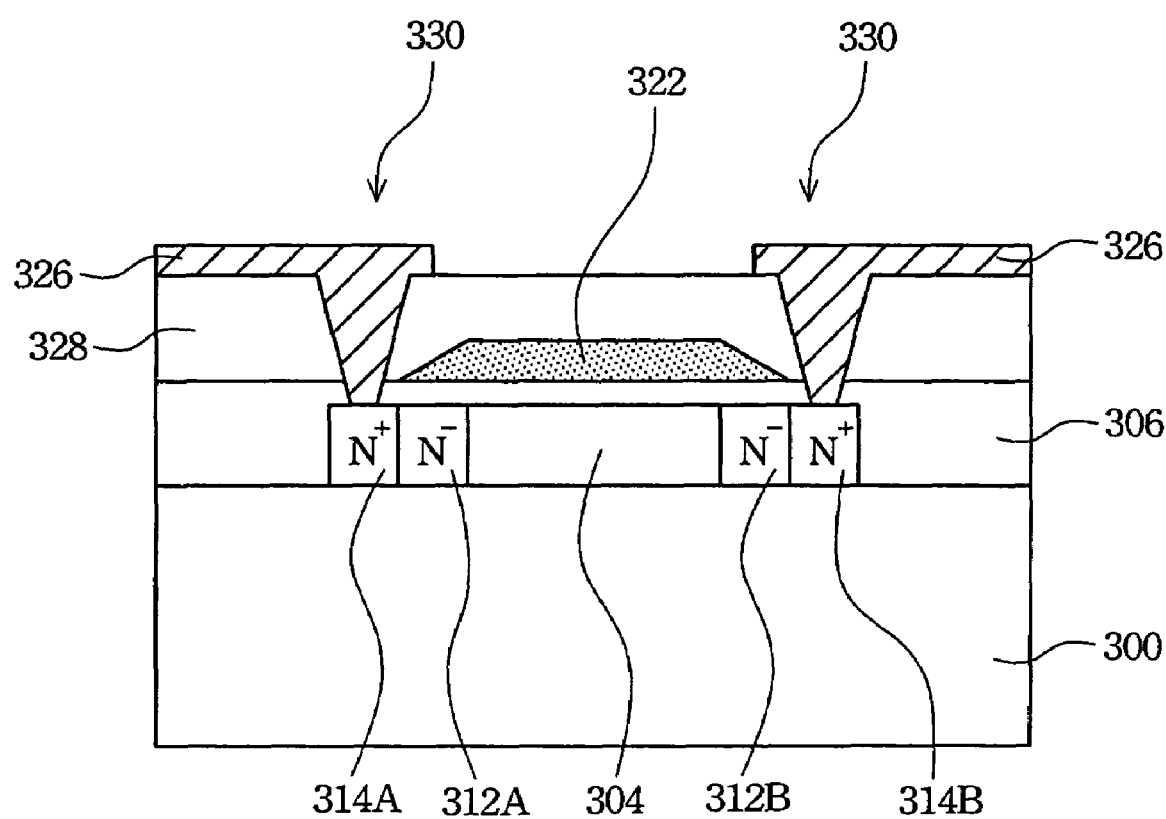
FIG. 7 is a cross-sectional view of a thin film transistor in accordance with the present invention.

Next, in FIG. 7, a passivation layer 328 is formed on the gate electrode 322, the four doped regions 314A, 312A, 314B and 312B and the insulating layer 306. The passivation layer 328 can be chosen from the group consisting of oxide, nitride and oxynitride. In a preferred embodiment, an oxide layer with a thickness between 2000 and 4000 angstroms can be formed by using chemical vapor deposition at about 330° C. The reaction gases for forming the silicon oxide or nitride layer can be $SiH_4$, $NH_3$, $N_2$ and $N_2O$ or $SiH_2Cl_2$, $NH_3$, $N_2$ and $N_2O$ Then, an etching step is performed to form a contact hole 330 on the passivation layer 328 and the insulating layer 306 for exposing the top surfaces of the doped regions 314A and 314B. Next, a transparent conducting layer 326 is formed on the passivation layer 328 and the exposed top surfaces of the doped regions 314A and 314B, in order to electrically connect to the doped regions 314A and 314B. In a preferred embodiment, an indium tin oxide (ITO) layer, which serves as the transparent conducting layer 326, is formed by sputtering at a temperature of about 25° C.

Figure 5:
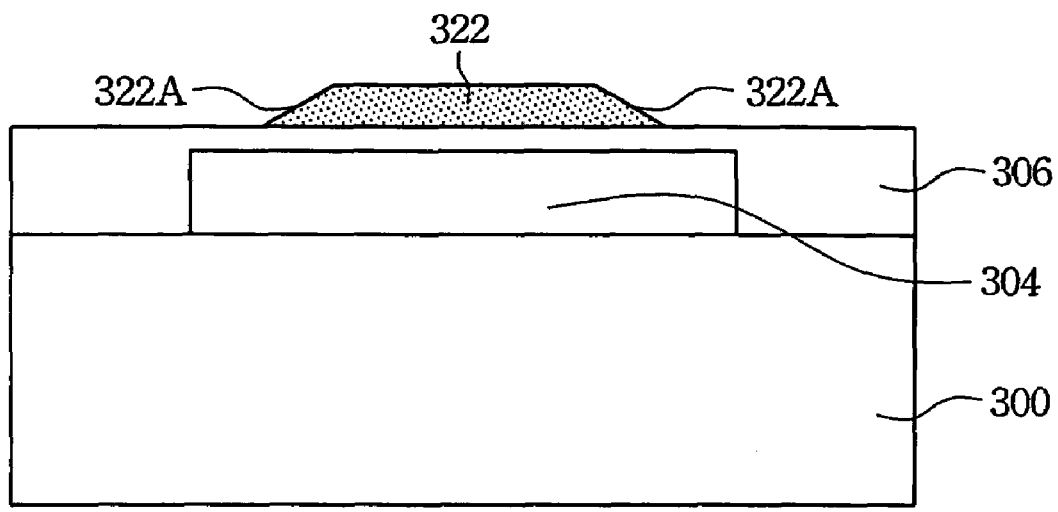
FIG. 5 is a cross-sectional view of a substrate that illustrates the step of isotropic etching the metal layer using the photoresist layer as a mask in accordance with the present invention.

Accordingly, referring to FIGS. 5 and 6, the gate electrode with inclined planes is used to serve as a mask to form the lightly doped drain in accordance with the present invention. In other words, an additional photolithography process step is not necessary for forming the lightly doped drain. Therefore, misalignment can be reduced. Moreover, the width of the lightly doped drain is related to the inclined planes of the gate electrode. In other words, the width of the lightly doped drain can be easily controlled by modifying the geometry of the inclined planes.

As can be understood by a person skilled in the art, the foregoing preferred embodiment of the present invention is illustrative of the present invention rather than limiting of the present invention. It is intended to cover various modifications and similar arrangements included within the spirit and scope of the appended claims, the scope of which should be accorded the broadest possible interpretation so as to encompass all such modifications and similar structure.

While the preferred embodiment of the invention has been illustrated and described, it will be appreciated that various changes can be made therein without departing from the spirit and scope of the invention.

What is claimed is:

1. A method for forming a lightly doped drain, said method comprising the following steps of:
   providing a substrate;
   forming an active layer over said substrate;
   forming an insulating layer over said active layer;
   forming a metal layer over said insulating layer;
   forming a patterned photoresist layer over said metal layer;
   performing an isotropic etching in said metal layer to form a gate electrode structure with inclined planes using said patterned photoresist layer as a mask;
   removing said patterned photoresist layer;
   performing an ion implantation into said active layer to form a source/drain electrode structure and lightly doped drains using said patterned gate electrode structure as a mask, wherein said lightly doped drains are located under the inclined planes of said gate electrode structure;
   forming a passivation layer over said insulating layer, said active layer and said gate electrode structure, wherein a plurality of contact holes are located in said passivation layer to expose the top surface of said source/drain electrode structure; and
   locating a transparent electrode layer over said passivation layer and contacting with said source/drain electrode structure through said contact holes.

2. The method of claim 1, wherein said active layer is a polysilicon layer.

3. The method of claim 1, wherein said insulating layer is a silicon oxide layer.

4. The method of claim 1, wherein said isotropic etching is wet etching.

5. A method for forming a lightly doped drain over a substrate, wherein an active layer is located over said substrate and an insulating layer is located over said active layer, said method comprising the following steps of:
   forming a metal layer over said insulating layer;

forming a patterned photoresist layer over said metal layer;

performing an isotropic etching in said metal layer to form a gate electrode structure with inclined planes using said patterned photoresist layer as a mask;

removing said patterned photoresist layer; and performing an ion implantation into said active layer to form a source/drain electrode structure and lightly doped drains using said patterned gate electrode structure as a mask, wherein said lightly doped drains are located under the inclined planes of said gate electrode structure.

6. The method of claim 5, wherein said active layer is a polysilicon layer.

7. The method of claim 5, wherein said insulating layer is a silicon oxide layer.

8. The method of claim 5, wherein said isotropic etching is wet etching.

* * * * *